(12) United States Patent
Cabral, Jr. et al.

(10) Patent No.: US 10,446,421 B2
(45) Date of Patent: Oct. 15, 2019

(54) CRYSTAL OSCILLATOR AND THE USE THEREOF IN SEMICONDUCTOR FABRICATION

(71) Applicant: GLOBALFOUNDRIES INC., Grand Cayman (KY)

(72) Inventors: Cyril Cabral, Jr., Yorktown Heights, NY (US); Lawrence A. Clevenger, Saratoga Springs, NY (US); John M. Cohn, Richmond, VT (US); Jeffrey P. Gambino, Portland, OR (US); William J. Murphy, North Ferrisburgh, VT (US); Anthony J. Telensky, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/951,547

(22) Filed: Apr. 12, 2018

(65) Prior Publication Data
US 2018/0231957 A1    Aug. 16, 2018

Related U.S. Application Data

(62) Division of application No. 14/147,996, filed on Jan. 6, 2014, now Pat. No. 9,971,341.

(51) Int. Cl.
*H01L 21/67*    (2006.01)
*C23C 14/54*    (2006.01)
(Continued)

(52) U.S. Cl.
CPC .... *H01L 21/67253* (2013.01); *G03F 7/70916* (2013.01); *G03F 7/70925* (2013.01);
(Continued)

(58) Field of Classification Search
CPC ............. G03F 7/70925; G03F 7/70916; G03F 7/7085; G03F 7/70483; H01L 21/67253;
(Continued)

(56) References Cited

U.S. PATENT DOCUMENTS 4,561,286 A    12/1985    Sekler et al.
5,117,192 A    5/1992    Hurd
(Continued)

OTHER PUBLICATIONS

Dias, M., "Investigating the Viability of MEMS Vapor Sensors for Detecting Land Mines", Carnegie Mellon University, Oct. 2000, 8 pages.
(Continued)

*Primary Examiner* — Zandra V Smith
*Assistant Examiner* — Jeremy J Joy
(74) *Attorney, Agent, or Firm* — Michael Le Strange; Andrew M. Calderon; Roberts Mlotkowski Safran Cole & Calderon P.C.

(57) ABSTRACT

Systems and methods are provided for implementing a crystal oscillator to monitor and control semiconductor fabrication processes. More specifically, a method is provided for that includes performing at least one semiconductor fabrication process on a material of an integrated circuit (IC) disposed within a processing chamber. The method further includes monitoring by at least one electronic oscillator disposed within the processing chamber for the presence or absence of a predetermined substance generated by the at least one semiconductor fabrication process. The method further includes controlling the at least one semiconductor fabrication process based on the presence or absence of the predetermined substance detected by the at least one electronic oscillator.

17 Claims, 4 Drawing Sheets

(51) Int. Cl.
*G01B 7/06* (2006.01)
*G03F 7/20* (2006.01)
*G05B 19/418* (2006.01)

(52) U.S. Cl.
CPC .......... *G05B 19/418* (2013.01); *C23C 14/546* (2013.01); *G01B 7/066* (2013.01); *G05B 2219/2602* (2013.01)

(58) Field of Classification Search
CPC ......... H01L 21/67276; H01L 21/67242; C23C 14/546; G05B 19/418; G01B 7/066
See application file for complete search history.

(56) References Cited

U.S. PATENT DOCUMENTS

| | | | |
|---|---|---|---|
| 5,287,725 A | 2/1994 | Zhao et al. | |
| 5,487,981 A | 1/1996 | Nivens et al. | |
| 5,684,276 A | 11/1997 | Altemir | |
| 5,795,993 A | 8/1998 | Pfeifer et al. | |
| 6,117,348 A | 9/2000 | Peng et al. | |
| 6,125,687 A | 10/2000 | McClelland et al. | |
| 6,457,360 B1 | 10/2002 | Daraktchiev et al. | |
| 6,468,814 B1 * | 10/2002 | Frees | H01L 21/67253 250/282 |
| 6,492,601 B1 | 12/2002 | Cain et al. | |
| 6,752,899 B1 * | 6/2004 | Singh | C23C 14/545 156/345.24 |
| 6,764,552 B1 * | 7/2004 | Joyce | B08B 7/0021 134/2 |
| 8,375,768 B2 | 2/2013 | Zeng et al. | |
| 9,645,125 B2 * | 5/2017 | Yang | G01N 33/0009 |
| 2002/0083409 A1 * | 6/2002 | Hamm | G03F 7/70925 356/237.1 |
| 2002/0198682 A1 | 12/2002 | Huang et al. | |
| 2003/0153180 A1 | 8/2003 | Marunaka et al. | |
| 2004/0040504 A1 * | 3/2004 | Yamazaki | C23C 14/042 118/715 |
| 2004/0206182 A1 | 10/2004 | Grimshaw | |
| 2006/0100824 A1 | 5/2006 | Moriya | |
| 2007/0138414 A1 * | 6/2007 | Stevens | G01N 21/94 250/504 R |
| 2008/0201088 A1 | 8/2008 | Miller | |
| 2011/0079178 A1 * | 4/2011 | Schramm | C23C 14/546 118/712 |
| 2012/0201954 A1 | 8/2012 | Wajid | |
| 2014/0007692 A1 | 1/2014 | Hines | |
| 2016/0215397 A1 | 7/2016 | Rinzan | |

OTHER PUBLICATIONS

Unknown., "Photoresist Detector, Reliably Protects PVD Cluster Tools from Photoresist Contamination", INFICON, 2007, 4 pages.

* cited by examiner

CRYSTAL OSCILLATOR AND THE USE THEREOF IN SEMICONDUCTOR FABRICATION

FIELD OF THE INVENTION

The invention relates generally to semiconductor fabrication, and more particularly, relates to systems and methods for implementing a crystal oscillator to monitor and control semiconductor fabrication processes.

BACKGROUND

The fabrication of integrated circuits (ICs) requires particular control of many different parameters including the detection of contaminants for minimizing contamination of semiconductor wafers and a consequent diminished yield of functional ICs. A residual gas analyzer (RGA) is a mass spectrometer that is commonly designed for the monitoring of contaminates in semiconductor fabrication vacuum systems. Specifically, RGAs are commonly used in vacuum degassing chambers during semiconductor fabrication to monitor the quality of the vacuum and detect minute traces of impurities (e.g., polymeric contaminants that may be present from previous photoresist processes) in a low-pressure gas environment.

SUMMARY

In a first aspect of the invention, a method is provided for that includes performing at least one semiconductor fabrication process on a material of an integrated circuit (IC) disposed within a processing chamber. The method further includes monitoring by at least one electronic oscillator disposed within the processing chamber for the presence or absence of a predetermined substance generated by the at least one semiconductor fabrication process. The method further includes controlling the at least one semiconductor fabrication process based on the presence or absence of the predetermined substance detected by the at least one electronic oscillator.

In another aspect of the invention, a method is provided for detecting a photoresist in a processing chamber. The method includes positioning at least one electronic oscillator adjacent to a material of an integrated circuit (IC) comprising the photoresist within the processing chamber. The method further includes performing a degassing process on the material of the IC within the processing chamber. The method further includes monitoring with the at least one electronic oscillator for a presence or absence of a polymeric material generated from the degassing process on the photoresist. The method further includes stopping the degassing process when the presence of the polymeric material is detected based on a change in frequency of an electrical signal of the at least one electronic oscillator.

In yet another aspect of the invention, a system is provided for that includes a CPU, a computer readable memory and a computer readable storage media. The system further includes program instructions to perform at least one semiconductor fabrication process on a material of an integrated circuit (IC) disposed within a processing chamber. The system further includes program instructions to generate an electrical signal using at least one electronic oscillator disposed within the processing chamber. The system further includes program instructions to monitor for a change in frequency of the electrical signal. The system further includes program instructions to determine a presence or absence of a predetermined substance generated by the at least one semiconductor fabrication process based on a change in mass of a crystal of the at least one electronic oscillator, which results in the change in the frequency of the electrical signal. The system further includes program instructions to control the at least one semiconductor fabrication process based on the presence or absence of the predetermined substance. The program instructions are stored on the computer readable storage media for execution by the CPU via the computer readable memory

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

Figure 1:
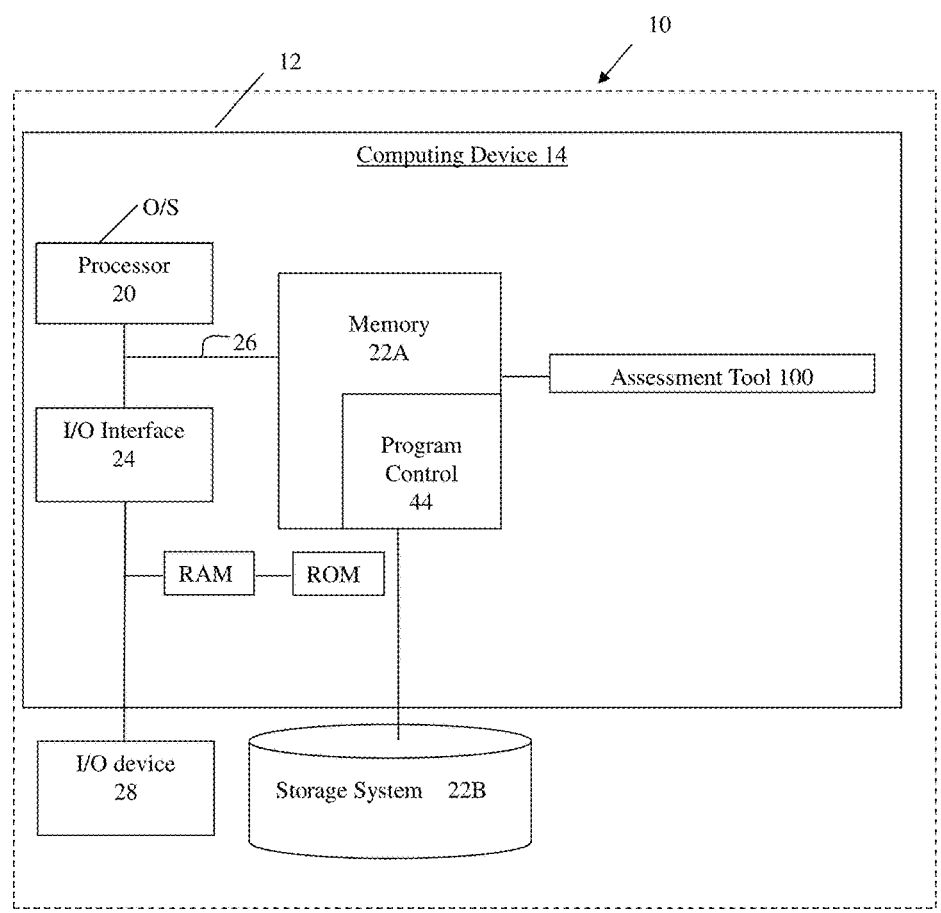
FIG. 1 is an illustrative external environment for implementing the invention in accordance with aspects of the invention.

The invention relates generally to semiconductor fabrication, and more particularly, relates to systems and methods for implementing a crystal oscillator to monitor and control semiconductor fabrication processes. In embodiments, a crystal oscillator monitoring and control system is provided that is configured to monitor for the presence of a predetermined substance (e.g., a contaminant or material from a particular semiconductor fabrication layer), and control at least one semiconductor fabrication process based on the presence of the predetermined substance or the absence thereof. In accordance with aspects of the present invention, the crystal oscillator monitoring and control system may be incorporated into present fabrication vacuum environments (e.g., semiconductor fabrication processing chambers such as degassing chambers or etching chambers). Advantageously, the crystal oscillator monitoring and control system of the present invention provides for greater detection and control accuracy than conventional systems combined with significant space and cost savings.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard, etc.

In general, the processor 20 executes computer program code (e.g., program control 44), which can be stored in the memory 22A and/or storage system 22B. Moreover, in accordance with aspects of the invention, the program control 44 controls an assessment tool 100 to perform the processes described herein. The assessment tool 100 can be implemented as one or more program code in the program control 44 stored in memory 22A as separate or combined modules. Additionally, the assessment tool 100 (e.g., an electronic design automation (EDA) tool) may be implemented as separate dedicated processors or a single or several processors to provide the function of this tool. While executing the computer program code, the processor 20 can read and/or write data to/from memory 22A, storage system 22B, and/or I/O interface 24. The program code executes the processes of the invention. The bus 26 provides a communications link between each of the components in the computing device 14.

In embodiments, the assessment tool 100 may be configured to obtain electrical signal data with a frequency from an electronic oscillator, and thereafter, control semiconductor fabrication processes based on the electrical signal data. For example, in accordance with aspects of the present invention, the assessment tool 100 may be configured to obtain electrical signal data with a frequency from an electronic oscillator, determine a change in the frequency from the electronic oscillator, and control a semiconductor fabrication process based on the determined change.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
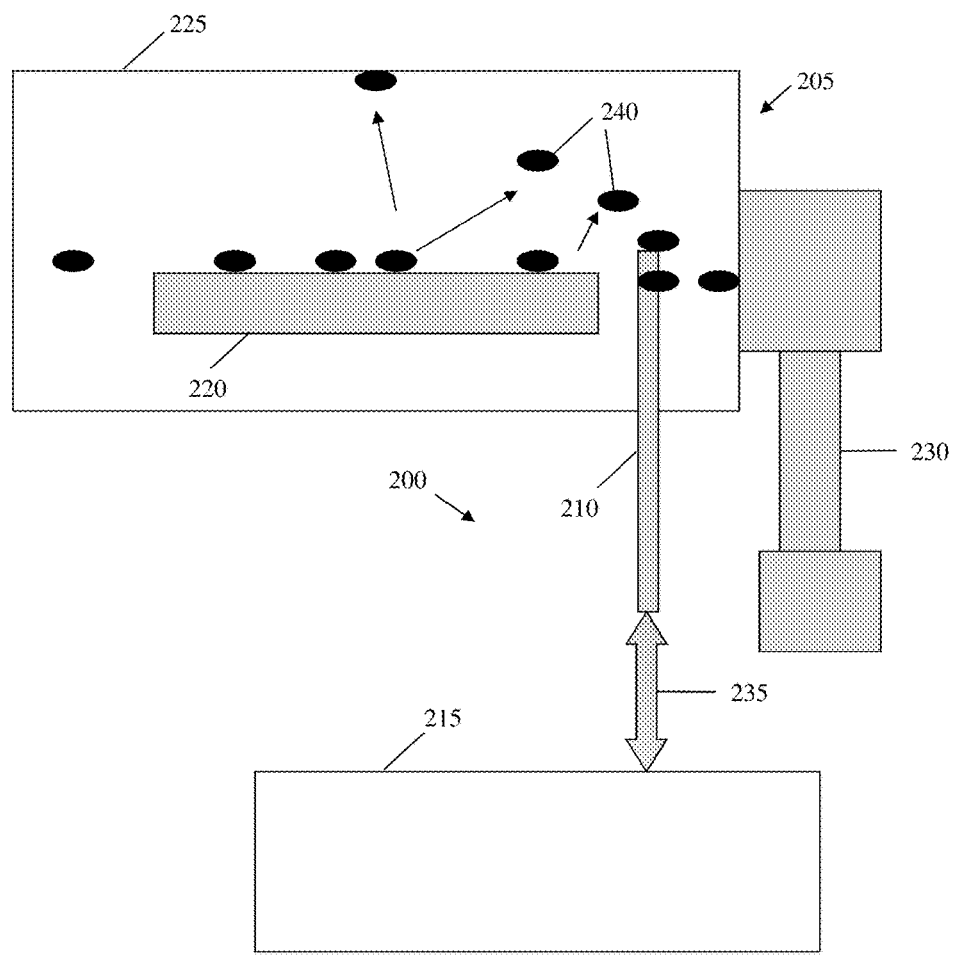
FIG. 2 is an illustrative schematic diagram of a system in accordance with aspects of the invention.

FIG. 2 shows a crystal oscillator monitoring and control system 200 configured to monitor and control semiconductor fabrication processes occurring within a processing environment 205. In embodiments, the crystal oscillator monitoring and control system 200 may comprise an electronic oscillator 210 and a computing device 215. The processing environment 205 may comprise a material of an IC 220 positioned in a processing chamber 225, and an optional pump 230. In embodiments, the processing chamber 225 may be any rigid enclosure configured for processing material of the IC 220. For example, the processing chamber 225 may be a vacuum chamber such as a degassing chamber or an etching chamber (e.g., a reactive-ion etching (RIE) low pressure chamber).

In embodiments, the material of the IC 220 may be a semiconductor wafer such as a substrate used in the fabrication of ICs and other micro-devices. In some embodiments, the material of the IC 220 may be any material used in the fabrication of the IC, e.g., a resist, Si, SiGe, hardmask, metals or metal alloys of a wiring layer, etc., that have been exposed to any number of microfabrication process steps including doping or ion implantation, etching, deposition of various materials, and photolithographic patterning used to fabricate the ICs and other micro-devices on the substrate.

In embodiments, the electronic oscillator 210 may be an electronic circuit that produces a repetitive, oscillating electronic signal, for example a sine wave or a square wave. The electronic oscillator 210 may be positioned within the processing chamber 225 such that the electronic oscillator 210 is facing the material of the IC and adjacent (i.e., in relative close proximity (e.g., within 1-10 mm)) to the material of the IC 220. Advantageously, the relative close proximity of the electronic oscillator 210 to the material of the IC 220 provides the electronic oscillator 210 with greater detection sensitivity for a predetermined substance than conventional systems (e.g., an RGA system that is positioned 10-100 cm from the material of the IC).

The electronic oscillator 210 may be characterized by a frequency of an output signal generated by the electronic oscillator 210. For example, a crystal oscillator is an electronic oscillator circuit that uses the mechanical resonance of a vibrating crystal of piezoelectric material to create an electrical signal with a particular frequency. A common type of piezoelectric resonator used in electronic oscillators is the quartz crystal, but other piezoelectric materials, e.g., polycrystalline ceramics, may be used in similar circuits within the spirit and scope of the present invention.

In embodiments in which the processing chamber 225 is configured as a low pressure or vacuum chamber, the pump 230 may be provided and configured as a device that removes gas molecules from a sealed volume of the processing chamber 225 in order to leave behind a partial vacuum or low pressure environment. For example, the pump 230 may be a vacuum pump such as a cryopump that traps gases and vapors by condensing them on a cold surface.

In embodiments, the computing device 215 may be the computing device 14 comprising assessment tool 100, as discussed herein with reference to FIG. 1, and configured to operate the processing chamber 225, the electronic oscillator 210, and semiconductor fabrication processes performed within the processing chamber 225. For example, the assessment tool 100 may be configured to obtain electrical signal data via wireless or wired communication 235 from the electronic oscillator 210 during a semiconductor fabrication process within the processing chamber 225. As discussed herein, the electrical signal data may be processed by the computing device 215 to determine a frequency of the electronic oscillator 210. Thereafter, the determined frequency of the electronic oscillator 210 may be used by the computing device 215 to control the semiconductor fabrication processes performed within the processing chamber 225, as discussed in greater detail with respect to FIGS. 3 and 4.

Accordingly, as shown in FIG. 2, the crystal oscillator monitoring and control system 200 may be configured in accordance with aspects of the present invention such that at least one electronic oscillator 210 comprising a piezoelectric resonator is used to monitor for the presence of a predetermined substance 240 within the processing chamber 225. For example, the at least one electronic oscillator 210 may be configured to generate an electrical signal with a predetermined frequency. However, when the predetermined substance 240 is present within the processing chamber 225 during performance of a semiconductor fabrication process on the material of the IC 210, the predetermined substance 240 collects on a crystal of the at least one electronic oscillator 210 and effectively changes the mass of the crystal. The effective mass change of the crystal of the at least one electronic oscillator 210 may be detected by the computing device 215 as a change in the predetermined frequency of the at least one electronic oscillator 210. In embodiments, the presence of the predetermined substance 240 may also change the quality factor of the at least one electronic oscillator 210 by causing damping of the mechanical resonance of the crystal, which may also be detectable by the computing device 215.

Advantageously, the crystal oscillator monitoring and control system of the present invention allows for the electronic oscillator to be positioned in relative close proximity of the source (e.g., the material of the IC 210) of the predetermined substance such that the detecting accuracy or sensitivity of the electronic oscillator is increased in comparison to conventional systems. Additionally, the size and complexity of the crystal oscillator monitoring and control system is smaller and simpler compared to conventional systems, and thus advantageously provides significant space and cost savings.

Figure 3:
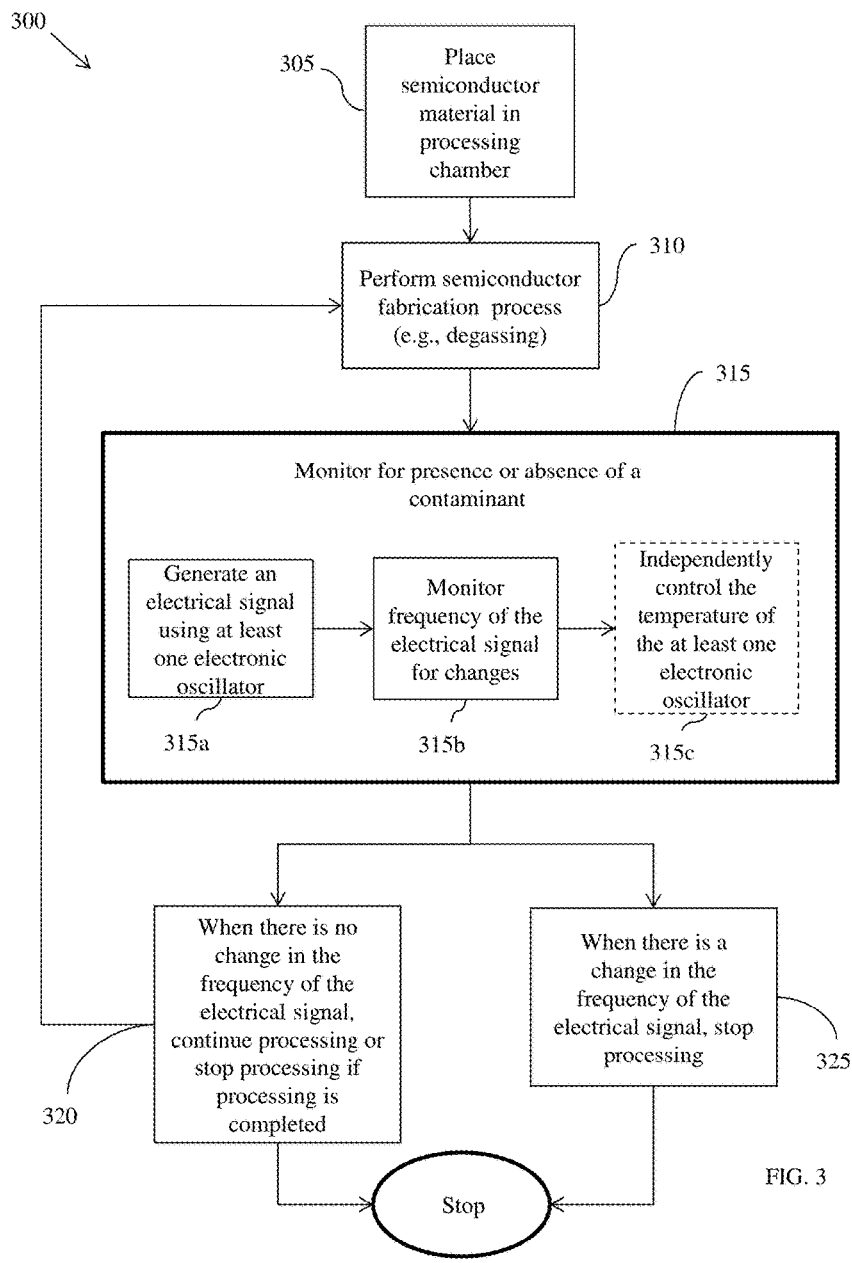
FIGS. 3 and 4 are illustrative process flows of implementing the system in accordance with aspects of the invention.
Figure 4:
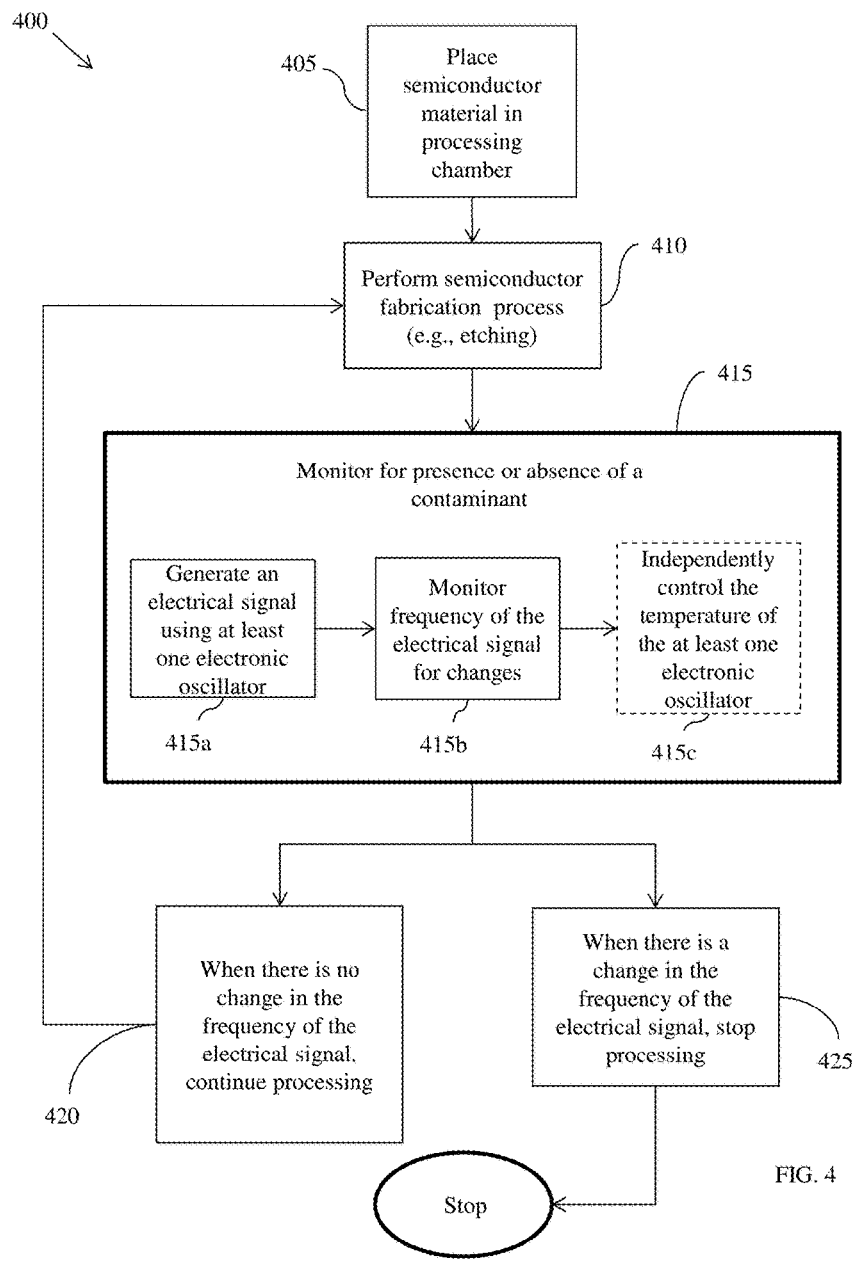

FIGS. 3 and 4 show exemplary flows for performing aspects of the present invention. The steps of FIGS. 3 and 4 may be implemented in the environments of FIGS. 1 and 2, for example.

The flowchart and block diagrams in FIGS. 3 and 4 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In embodiments, the at least one electronic oscillator may be used to monitor for the presence of a contaminants, such as volatile contaminants, present from degassing processes performed on a material of the IC, e.g., a material of the IC comprising photoresist material or the remnants thereof. In accordance with these aspects of the present invention, at least one processor may be used to control at least one semiconductor fabrication process based on the presence or absence of the contaminant.

FIG. 3 shows a process 300 for monitoring for the presence or absence of a contaminant in a processing chamber, and control of at least semiconductor fabrication process based on the determined presence or absence of the contaminant. At step 305, a material of the IC (e.g., a semiconductor substrate comprising IC structures) is placed within a processing chamber (e.g., a degassing chamber). In embodiments, the placing of the material of the IC into the processing chamber may be performed automatically using fabrication tools of a manufacturing line or may be performed manually by a fabricator. As discussed above with respect to FIG. 2, the material of the IC may be placed within the processing chamber adjacent (i.e., in relative close proximity (e.g., in the range of 1-10 mm)) to at least one electronic oscillator.

At step 310, the material of the IC may be exposed to at least one semiconductor fabricating process within the processing chamber. In embodiments, the at least one semiconductor process may include a degassing process comprising heating the material of the IC and generating a low pressure or vacuum environment to remove impurities (e.g., contaminants) from the material of the IC. In some instances of performing the degassing process, a predetermined substance or contaminant may be removed from the material of the IC that is of particular interest to a semiconductor fabricator.

For example, during the fabrication process of ICs on a semiconductor substrate, the substrate may be exposed to any number of photolithographic steps that comprise forming a photoresist on the semiconductor substrate, patterning the photoresist, using the patterned photoresist to etch or deposit semiconductor structures on the substrate, and removing the photoresist from the semiconductor substrate. The photoresist material typically comprises polymeric materials such as poly(methyl methacrylate) or poly(methyl glutarimide). In some instances, the removing process of the photoresist from the semiconductor substrate may not result in a complete removal of the polymeric material from the semiconductor substrate. Therefore, the presence of the polymeric material on a semiconductor substrate exposed to a degassing processing is of particular interest to semiconductor fabricators because the degassing process may be inadequate to remove all of the remnant polymeric material from the semiconductor substrate. If the remnant polymeric material is not completely removed from the semiconductor substrate, then the remnant polymeric material may contaminate a subsequent semiconductor fabrication process (e.g., a metal deposition process).

Accordingly, at step 315, the at least one electronic oscillator (e.g., a crystal oscillator) may be controlled to monitor for the presence or the absence of the contaminant (e.g., the remnant polymeric material). The monitoring may be performed during the entirety of the at least one semiconductor fabricating process or the monitoring may be performed during only a portion of the at least one semiconductor fabricating process.

In embodiments, the monitoring step 315 may comprise subprocesses comprising steps 315a, 315b, and 315c. At step 315a, the at least one electronic oscillator may be controlled to generate an electrical signal with a predetermined frequency. At step 315b, the predetermined frequency of the electrical signal may be monitored for changes. For example, the resonant frequency of the at least one electronic oscillator is equal to the propagation velocity of the electrical signal divided by two times the thickness of the vibrating crystal (e.g., the quartz crystal). In other words, $f=(c\_t/2*q)$, where f is the resonant frequency, c_t is the propagation velocity in the direction of the film thickness, and q is the thickness of the vibrating crystal. The change in frequency of the electrical signal may be monitored as a function of time using first derivatives (e.g., $df/dt \sim dq/dt$, where t is time) such that changes in q caused by deposition or adsorption of a predetermined substance (e.g., the contaminant) on the vibrating crystal results in a change in q of the vibrating crystal, and thus a change in f over t. Additionally or alternatively, second derivatives may also be useful for picking up elements of different mass impacting the change in f over t. Advantageously, the monitoring of the change in frequency of the at least one electronic oscillator over time is sensitive enough to detect atomic layer deposition or adsorption (e.g., the deposition or adsorption of a 10-40 Å thick layer) of a predetermined substance (e.g., the contaminant) on the at least one electronic oscillator.

Optionally at step 315c, the temperature of the at least one electronic oscillator may be independently controlled (e.g., the temperature of the at least one electronic oscillator may be increased or decreased irrespective of the temperature of the processing chamber and/or material of the IC) to enhance a signal margin of the electrical signal to more accurately detect a change in the frequency of the electrical signal. As should be understood, when the contaminant is present within the processing chamber during performance of the at least one semiconductor fabrication process on the material of the IC, the contaminant collects on the at least one electronic oscillator and effectively changes the mass of the oscillator. The effective mass change of the at least one electronic oscillator may be detected as the change in the predetermined frequency of the at least one electronic oscillator. In additional or alternative embodiments, the presence of the contaminant may also change the quality factor of the at least one electronic oscillator by causing damping, which may also be monitored and detected in accordance with aspects of the present invention.

At step 320, when there is no change detected in the predetermined frequency of the electrical signal (i.e., determined absence of the contaminant), the at least one semiconductor fabricating process may be controlled to continue processing (e.g., degassing) or controlled to stop processing if the first semiconductor fabricating process has been completed (e.g., all impurities have been removed from the material of the IC). At step 325, when there is a change detected in the predetermined frequency of the electrical signal (i.e., determined presence of the contaminant), the at least one semiconductor fabricating process may be stopped, and further semiconductor fabrication processing may not be performed on the material of the IC (e.g., the material of the IC is thrown away).

Advantageously, the crystal oscillator monitoring and control process 300 of the present invention allows for the at least one electronic oscillator to be positioned in close proximity of the source of the contaminant such that the detecting accuracy or sensitivity of the electronic oscillator is increased in comparison to conventional systems. For example, in conventional systems (e.g., an RGA system) the detection device is positioned outside the processing chamber or at least 10-100 cm from the source of the contaminant. Therefore, the contaminant may resorb to cool surfaces of the processing chamber and never make it to the detection device, which consequently lowers the sensitivity of the conventional systems. Additionally, the independent control of the temperature of the at least one electronic oscillator allows for the signal margin of the electrical signal to be enhanced, and consequently increases the accuracy of detecting a frequency change of the at least one electronic oscillator.

In additional or alternative embodiments, the at least one electronic oscillator may be used to monitor for the presence of an etched substance from a material of the IC, such as a deposition layer material, resulting from etching processes performed on the material of the IC, e.g., a material of the IC comprising a deposited metal layer. In accordance with these aspects of the present invention, at least one processor may be used to control at least one semiconductor fabrication process based on the presence or absence of the etched substance.

FIG. 4 shows a process 400 for monitoring for the presence or absence of an etched substance in a processing chamber, and control of at least one semiconductor fabrication process based on the determined presence or absence of the etched substance. At step 405, a material of the IC comprising at least a first layer formed on a second layer (e.g., a semiconductor substrate comprising at least one layer deposited on another layer) is placed within a processing chamber (e.g., an etching chamber). In embodiments, the placing of the material of the IC into the processing chamber may be performed automatically using fabrication tools of a manufacturing line or may be performed manually by a fabricator. As discussed above with respect to FIG. 2, the material of the IC may be placed within the processing chamber adjacent (i.e., in relative close proximity (e.g., in the range of 1-10 mm)) to at least one electronic oscillator.

At step 410, the material of the IC may be exposed to the at least one semiconductor fabricating process within the processing chamber. In embodiments, the at least one semiconductor process may include an etching process comprising etching the first layer of the material of the IC to remove material thereof (e.g., a portion of a deposited layer). In some instances of performing the etching process, the first layer or a portion thereof may be removed exposing the second layer or a portion thereof, and stopping the etchant prior to removal of the exposed second layer is of a particular interest to a semiconductor fabricator.

For example, during the fabrication process of ICs on a semiconductor substrate, the substrate may be exposed to any number of depositing and etching steps that comprise depositing a first layer on a second layer, forming a photoresist pattern on the first layer, and using the patterned photoresist to etch structures into the first layer. The first layer and the second layer are commonly formed as thin layers (e.g., 200-1000 Å). Therefore, stopping the etching process with increased accuracy prior to etching of the second layer is of particular interest to semiconductor fabricators in order to fabricate semiconductor structures in accordance with stringent design specifications for the ICs being built on the semiconductor substrate.

Accordingly, at step 415, the at least one electronic oscillator (e.g., a crystal oscillator) may be controlled to monitor for the presence or the absence of the etched substance (e.g., the material from the second layer, which is not intended to be etched). The monitoring may be performed during the entirety of the at least one semiconductor fabricating process or the monitoring may be performed during only a portion of the at least one semiconductor fabricating process.

In embodiments, the monitoring step 415 may comprise subprocesses comprising steps 415a, 415b, and 415c. At step 415a, the at least one electronic oscillator may be controlled to generate an electrical signal with a predetermined frequency. At step 415b, the predetermined frequency of the electrical signal may be monitored for changes (e.g., monitoring the change in frequency as a function of time as discussed with respect to FIG. 3). Optionally at step 415c, the temperature of the at least one electronic oscillator may be independently controlled (e.g., the temperature of the at least one electronic oscillator may be increased or decreased irrespective of the temperature of the processing chamber and/or material of the IC) to enhance a signal margin of the electrical signal to more accurately detect a change in the frequency of the electrical signal. As should be understood, when the etched substance is present within the processing chamber during performance of the at least one semiconductor fabrication process on the material of the IC, the etched substance collects on the at least one electronic oscillator and effectively changes the mass of the oscillator. The effective mass change of the at least one electronic oscillator may be detected as the change in the predetermined frequency of the at least one electronic oscillator. In additional or alternative embodiments, the presence of the etched substance may also change the quality factor of the at least one electronic oscillator by causing damping, which may also be monitored and detected in accordance with aspects of the present invention.

At step 420, when there is no change detected in the predetermined frequency of the electrical signal (i.e., determined absence of the etched substance), the at least one semiconductor fabricating process may be controlled to continue etching the first layer. At step 425, when there is a change detected in the predetermined frequency of the electrical signal (i.e., determined presence of the etched substance), the at least one semiconductor fabricating process may be stopped (e.g., the etching process is stopped prior to removal of the second layer or a portion thereof).

Advantageously, the crystal oscillator monitoring and control process 400 of the present invention allows for the at least one electronic oscillator to be positioned in close proximity of the object being etched such that the detecting accuracy or sensitivity of the electronic oscillator is increased in comparison to conventional systems. For example, in conventional systems (e.g., an optical emissions detection system) the detection device is positioned outside the processing chamber or at least 10-100 cm from the object being etched, or there is no detection device and the etching process is merely stopped based on timing. Therefore, the etched material may resorb to cool surfaces of the processing chamber and never make it to the detection device, or may be susceptible to timing assumptions for highly variable etch conditions.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   performing at least one semiconductor fabrication process on a material of an integrated circuit (IC) disposed within a processing chamber;
   monitoring by at least one electronic oscillator disposed within the processing chamber for the presence or absence of a predetermined substance generated by the at least one semiconductor fabrication process; and
   controlling the at least one semiconductor fabrication process based on the presence or absence of the predetermined substance detected by the at least one electronic oscillator, wherein the predetermined substance is a contaminant in a degassing process and the monitoring of the presence or absence of the contaminant is determined when a thickness of the contaminant deposited on a crystal of the at least one electronic oscillator is within a predetermined value.

2. The method of claim 1, further comprising positioning the material of the IC in the processing chamber adjacent to the at least one electronic oscillator prior to performing the at least one semiconductor fabrication process.

3. The method of claim 2, wherein the material of the IC is positioned within 1-10 mm of the at least one electronic oscillator.

4. The method of claim 2, wherein the monitoring for the presence or absence of the predetermined substance comprises:
   generating an electrical signal using the at least one electronic oscillator;
   monitoring for a change in frequency of the electrical signal; and
   determining the presence of the predetermined substance is a change in mass of the crystal of the at least one electronic oscillator, which results in a change in the frequency of the electrical signal.

5. The method of claim 4, wherein the monitoring for the presence or absence of the predetermined substance further comprises determining the absence of the predetermined substance when there is no change in the frequency of the electrical signal.

6. The method of claim 5, wherein the monitoring for the presence or absence of the predetermined substance further comprises independently controlling a temperature of the at least one electronic oscillator such that a signal margin of the electrical signal is enhanced.

7. The method of claim 5, wherein the at least one semiconductor fabrication process is a degassing process and the predetermined substance is a contaminant from a photoresist layer.

8. The method of claim 7, wherein the controlling the at least one semiconductor fabrication process comprises:
   when there is no change in the frequency of the electrical signal, continuing the degassing process; and
   when there is the change in the frequency of the electrical signal, stopping the degassing process.

9. The method of claim 1, wherein the predetermined value is between 10-40 Å.

10. A method of detecting a photoresist in a processing chamber, comprising:
    positioning at least one electronic oscillator adjacent to a material of an integrated circuit (IC) comprising the photoresist within the processing chamber;
    performing a degassing process on the material of the IC within the processing chamber;
    monitoring with the at least one electronic oscillator for a presence or absence of a polymeric material generated from the degassing process on the photoresist; and
    stopping the degassing process when the presence of the polymeric material is detected based on a change in frequency of an electrical signal of the at least one electronic oscillator, wherein:
    the polymeric material is a contaminant in the material, which contaminant is released into the processing chamber during the degassing process, and
    the presence or absence of the contaminant is determined when a thickness of the contaminant deposited on a crystal of the at least one electronic oscillator during the degassing process is a value between 10-40 Å.

11. The method of claim 10, wherein the material of the IC is positioned within 1-10 mm of the at least one electronic oscillator.

12. The method of claim 10, wherein the monitoring for the presence or absence of the polymeric material comprises determining the presence of the polymeric material when there is a change in mass of a crystal of the at least one electronic oscillator, which results in the change in the frequency of the electrical signal.

13. The method of claim 12, wherein the monitoring for the presence or absence of the polymeric material further comprises determining the absence of the polymeric material, when there is no change in the frequency of the electrical signal.

14. The method of claim 13, wherein the monitoring for the presence or absence of the polymeric material further comprises independently controlling a temperature of the at least one electronic oscillator such that a signal margin of the electrical signal is enhanced.

15. The method of claim 13, further comprising continuing the degassing process when there is no change in the frequency of the electrical signal detected.

16. The method of claim 10, wherein the contaminant is a volatile contaminant.

17. The method of claim 16, wherein the photoresist is comprised of at least one of poly methyl methacrylate and poly methyl glutarimide.

* * * * *